(12) United States Patent
Park (10) Patent No.: US 8,546,835 B2
(45) Date of Patent: Oct. 1, 2013

(54) LIGHT EMITTING DEVICE

(75) Inventor: Kyung Wook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/042,678

(22) Filed: Mar. 8, 2011

(65) Prior Publication Data

US 2011/0220955 A1    Sep. 15, 2011

(30) Foreign Application Priority Data

Mar. 9, 2010  (KR) .......................... 10-2010-0020649

(51) Int. Cl.
*H01L 33/64* (2010.01)

(52) U.S. Cl.
USPC ................................. 257/99; 257/E33.075

(58) Field of Classification Search
USPC ............................................ 257/99, E33.075
See application file for complete search history.

(56) References Cited

U.S. PATENT DOCUMENTS

| | | | |
|---|---|---|---|
| 7,505,495 B2 | 3/2009 | Fratti et al. | |
| 7,714,336 B2 | 5/2010 | Imai | |
| 2004/0022433 A1* | 2/2004 | Acharya et al. | 382/165 |
| 2004/0222433 A1* | 11/2004 | Mazzochette et al. | 257/99 |
| 2007/0085101 A1* | 4/2007 | Kim | 257/98 |
| 2008/0006843 A1* | 1/2008 | Dai et al. | 257/99 |
| 2009/0065799 A1* | 3/2009 | Kim et al. | 257/99 |
| 2009/0153007 A1* | 6/2009 | Jiang | 313/11 |
| 2010/0127299 A1* | 5/2010 | Smith et al. | 257/99 |
| 2011/0278624 A1* | 11/2011 | Nam | 257/98 |
| 2011/0316024 A1* | 12/2011 | Hung et al. | 257/98 |

FOREIGN PATENT DOCUMENTS

| | | |
|---|---|---|
| CN | 101106169 A | 1/2008 |
| CN | 201110527 Y | 9/2008 |
| JP | 2-143872 A | 6/1990 |
| JP | 08-70070 A | 3/1996 |
| JP | 8-135171 | 5/1996 |
| JP | 2001-015635 A | 1/2001 |
| JP | 2002-304902 A | 10/2002 |
| JP | 2005-209959 A | 1/2004 |
| JP | 2005-149943 A | 6/2005 |
| JP | 2005-340392 A | 12/2005 |
| JP | 2006-191465 A | 7/2006 |
| JP | 2007-258520 A | 10/2007 |
| JP | 2008-288307 A | 11/2008 |
| JP | 2009-99406 A | 5/2009 |
| JP | 2009-152268 A | 7/2009 |
| JP | 2009-224538 A | 10/2009 |
| KR | 10-2000-0056801 | 9/2000 |
| KR | 10-2008-0113313 A | 12/2008 |
| WO | WO 2005/111715 A2 | 11/2005 |
| WO | WO 2010095811 A2 * | 8/2010 |

OTHER PUBLICATIONS

JP 2006191465 english translation.*

* cited by examiner

*Primary Examiner* — William D Coleman
*Assistant Examiner* — Christine Enad
(74) *Attorney, Agent, or Firm* — McKenna Long & Aldridge LLP

(57) ABSTRACT

Disclosed is a light emitting device. The light emitting device includes a body, a plurality of electrodes in the body, a light emitting chip installed in the body and electrically connected to the electrodes to generate light, and a thermo electric cooler module electrically connected to the electrodes and formed at a lower portion of the light emitting chip to cool the light emitting chip.

16 Claims, 6 Drawing Sheets

LIGHT EMITTING DEVICE

The present application claims priority under 35 U.S.C. §119(a) of Korean Patent Application No. 10-2010-0020649 filed on Mar. 9, 2010, which is hereby incorporated by reference in its entirety as if fully set forth herein.

BACKGROUND

The embodiment relates to a light emitting device.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps used in the interior or outdoor of a building, liquid crystal displays, electric signboards, and street lamps.

SUMMARY

The embodiment provides a light emitting device capable of improving reliability.

According to the embodiment, the light emitting device includes a body, a plurality of electrodes in the body, a light emitting chip installed in the body and electrically connected to the electrodes to generate light, and a thermo electric cooler module electrically connected to the electrodes and formed at a lower portion of the light emitting chip to cool the light emitting chip.

The embodiment can provide a light emitting device including a thermo electric cooler module to prevent a light emitting chip from being heated, thereby improving reliability.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device according to the embodiment will be described with reference to accompanying drawings.

Figure 1:
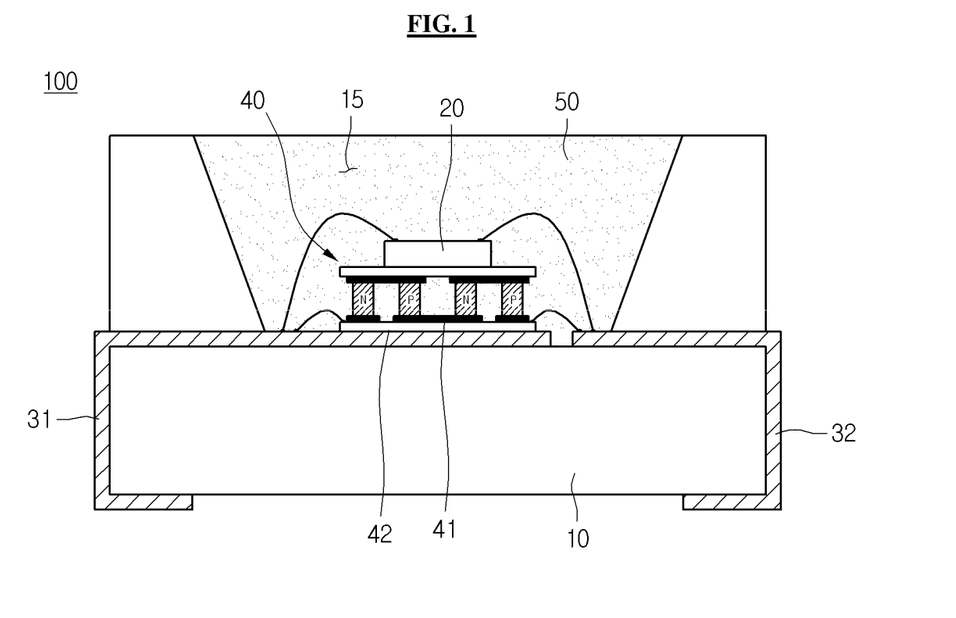
FIG. 1 is a sectional view showing a light emitting device according to a first embodiment.

FIG. 1 is a sectional view showing a light emitting device 100 according to a first embodiment.

Referring to FIG. 1, the light emitting device 100 according to the first embodiment includes a body 10, a plurality of electrodes 31 and 32 installed in the body 10, a light emitting chip 20 installed in the body 10 and electrically connected to the electrodes 31 and 32 to emit light, and a thermo electric cooler module 40 electrically connected to the electrodes 31 and 32 to cool the light emitting chip 20.

The body 10 may include at least one selected from the group consisting of resin material such as PPA (Polyphthalamide), silicon, metallic material, PSG (Photo sensitive glass), sapphire (AL2O3), and a printed circuit board (PCB).

If the body 10 includes material having electrical conductivity, an insulating layer (not shown) is additionally formed on the surface of the body 10 such that the body 10 is prevented from being electrically shorted with the electrodes 31 and 32.

A top surface of the body 10 may have various shapes such as a rectangular shape, a polygonal shape, and a circular shape according to the use and the design of the light emitting device 100.

A cavity 15 may be formed in the body 10 such that the body 10 has an open upper portion. The cavity 15 may have a cup shape or a concave container shape. The inner lateral surface of the cavity 15 is perpendicular to the bottom surface of the body or inclined with respect to the bottom surface. When viewed in a plan view, the cavity 15 may have a circular shape, a rectangular shape, a polygonal shape, or an oval shape.

The electrodes 31 and 32 are spaced apart from each other in the body 10 so as to be electrically insulated from each other. The electrodes 31 and 32 are electrically connected to the light emitting chip 20 to supply power to the light emitting chip 20.

As shown in FIG. 1, the electrodes 31 and 32 include the first electrode 31 and the second electrode 32. The electrodes 31 and 32 may have various modifications according to the design of the light emitting device 100, but the embodiment is not limited thereto.

One ends of the electrodes 31 and 32 are provided in the cavity 15 of the body 10, and opposite ends of the electrodes 31 and 32 are provided on the rear surface of the body 10, but the embodiment is not limited thereto.

The electrodes 31 and 32 may include metallic material, for instance, at least one selected from the group consisting of Ti, Cu, Ni, Au, Cr, Ta, Pt, Sn, Ag, and P. The electrodes 31 and 32 may have a single layer structure or a multiple layer structure.

The thermo electric cooler module 40 is electrically connected to the electrodes 31 and 32 and driven to cool the light emitting chip 20 so that the light emitting chip 20 is prevented from being heated.

The thermo electric cooler module 40 may be formed on one of the electrodes 31 and 32 or may be formed on the body 10, but the embodiment is not limited thereto.

Figure 2:
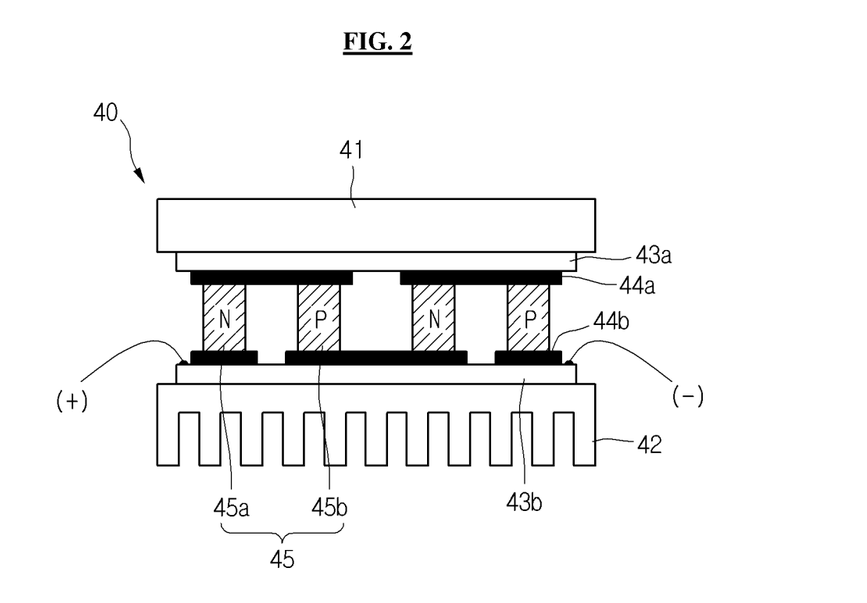
FIG. 2 is a sectional view showing a thermo electric cooler module of the light emitting device of FIG. 1.

Hereinafter, the structure and the operation of the thermo electric cooler module 40 will be described in detail.

FIG. 2 is a sectional view showing the thermo electric cooler module 40.

Referring to FIG. 2, the thermo electric cooler module 40 includes a cooling plate 41, a first thermal conductive insulating plate 43a under the cooling plate 41, a plurality of first polar plates 44a under the first thermal conductive insulating plate 43a, a plurality of semiconductor pairs 45 electrically connected in series under the first polar plate 44a, a plurality of second polar plates 44b under the semiconductor pairs 45, second thermal conductive insulating plates 43b under the second polar plates 44b, and a heat dissipating plate 42 under the second thermal conductive insulating plate 43b.

The semiconductor pairs 45 include at least a pair of N and P type semiconductors 45a and 45b that are alternately aligned with each other in a row direction. The N and P type semiconductors 45a and 45b are electrically connected to each other in series by the first polar plates 44a and the second polar plates 44b.

If DC voltage is applied both terminals (plus and minus terminals) of the first and second polar plates 44a and 44b, heat is transferred according to the flow of electrons in the case of the N type semiconductor 45a, or according to the flow of holes in the case of the P type semiconductor 45b, so that the cooling plate 41 is cooled, and the heat dissipating plate 42 is heated.

The first thermal conductive insulating plate 43a is interposed between the cooling plate 41 and the first polar plates 44a, and the second thermal conductive insulating plates 43b is interposed between the heat dissipating plate 42 and the second polar plates 44b, such that heat can be smoothly transferred while the first polar plates 44a are being prevented from being electrically shorted with the second polar plates 44b.

In detail, the thermo electric cooler module 40 employs a Peltier effect in which heat is generated or absorbed at the contact part between two different conductive materials when current flows due to the contact between the two different conductive materials. According to the Peltier effect, in order to transfer carriers from a material having low potential energy to a material having high potential energy based on the potential energy difference between two different conductive materials, external energy is required. Accordingly, thermal energy is absorbed at the contact point. In contrast, in order to transfer carriers a material having high potential energy to a material having low potential energy, thermal energy is dissipated.

Such a thermo electric cooler module 40 is reduced in size and weight so as to be installed in the light emitting device 100. In addition, uses of the cooling plate 41 and the heat dissipating plate 42 may be changed to each other according to the polarities of the DC voltage. In addition, the intensity of the DC voltage is controlled, so that temperature can be exactly controlled. In addition, the life span of the thermo electric cooler module 40 is semi permanent and eco-friendly because the principle of movement of electrons and holes in N and P type semiconductors is used instead of the mechanical principle.

Accordingly, the thermo electric cooler module 40 can effectively cool the light emitting chip 20 and prevent the light emitting chip 20 from being heated, so that the reliability of the light emitting device 100 can be improved.

FIG. 1 shows that the cooling plate 41 and the heat dissipating plate 42 of the thermo electric cooler module 40 are separately formed. Differently, the cooling plate 41 may be the lower most layer of the light emitting chip 20 formed on the thermo electric cooler module 40, and the heat dissipating plate 42 may be an electrode 31 under the thermo electric cooler module 40.

Referring to FIGS. 1 and 2, the light emitting chip 20 may be mounted on the cooling plate 41 of the thermo electric cooler module 40, and electrically connected to the electrodes 31 and 32 to generate light.

The light emitting chip 20 includes a light emitting structure layer including an undoped semiconductor layer including a buffer layer on the substrate, a first conductive semiconductor layer formed on the undoped semiconductor layer, an active layer, and a second conductive semiconductor layer, a transparent electrode on the second conductive semiconductor layer, a first electrode on the first conductive semiconductor layer, and a second electrode on the transparent electrode layer.

The growth substrate may include one selected from the group consisting of Al2O3, Si, SiC, GaAs, ZnO, and MgO. For example, the growth substrate may include a sapphire substrate.

The undoped semiconductor layer may include a GaN-based semiconductor. For instance, the undoped semiconductor layer may include an undoped GaN layer grown by injecting trimethyl gallium (TMGa) gas together with ammonia ($NH_3$) gas and hydrogen ($H_2$) gas into a chamber.

The first conductive semiconductor layer may include an N type semiconductor layer. The first conductive semiconductor layer may include semiconductor material having a compositional formula of $In_xAl_yGa_{1-x-y}N$ ($0 \leq x \leq 1$, $0 \leq y \leq 1$, $0 \leq x+y < 1$). For example, the first conductive semiconductor layer may include a material selected from the group consisting of InAlGaN, GaN, AlGaN, AlInN, InGaN, AN, and InN, and may be doped with N type dopants such as Si, Ge, and Sn.

Electrons (or holes) injected through the first conductive semiconductor layer may be recombined with holes (or electrons) injected through the second conductive semiconductor layer in the active layer, so that the active layer emits the light based on the band gap difference of the energy band according to the intrinsic material of the active layer.

The active layer may have a single quantum well structure, a multiple quantum well (MQW) structure, a quantum dot structure, or a quantum wire structure but the embodiment is not limited thereto.

The active layer may include semiconductor material having a compositional formula of $In_xAl_yGa_{1-x-y}N$ ($0 \leq x \leq 1$, $0 \leq y \leq 1$, $0 \leq x+y \leq 1$). If the active layer has the MQW structure, the active layer may include a stack structure of well/barrier layers. For example, the active layer may have the stack structure of InGaN well/GaN barrier layers.

A clad layer (not shown) doped with the n type or p type dopant can be formed on and/or under the active layer. The clad layer may include an AlGaN layer or an InAlGaN layer.

The second conductive semiconductor layer may include a P type semiconductor layer. The second conductive semiconductor layer may include semiconductor material having a compositional formula of $In_xAl_yGa_{1-x-y}N$ ($0 \leq x \leq 1$, $0 \leq y \leq 1$, $0 \leq x+y \leq 1$). For instance, the second conductive semiconductor layer may be selected from the group consisting of InAlGaN, GaN, AlGaN, InGaN, AlInN, AN, and InN, and may be doped with P type dopants such as Mg, Zn, Ca, Sr, and Ba.

Meanwhile, the first conductive semiconductor layer may include a P type semiconductor layer, and the second conductive semiconductor layer may include an N type semiconductor layer. In addition, a third conductive semiconductor layer including an N type semiconductor layer or a P type semiconductor layer may be formed on the second conductive semiconductor layer. Accordingly, the light emitting structure layer may have at least one of NP, PN, NPN, and PNP junction structures. In addition, the doping concentration of impurities in the first and second conductive semiconductor layers may be uniform or irregular. In other words, the light emitting structure layer may have various structures, but the embodiment is not limited thereto.

The light emitting structure layer including the first conductive semiconductor layer, the active layer, and the second conductive semiconductor layer may have various modifications, but the disclosure is not limited to the above structure of the light emitting structure layer according to the embodiment.

The transparent electrode layer is interposed between the second conductive semiconductor layer and the second electrode to act as an ohmic contact layer. For example, the transparent electrode layer may include at least one selected from the group consisting of ITO, ZnO, $RuO_x$, $TiO_x$, and $IrO_x$.

The transparent electrode layer may be not essentially required, and the second electrode may be directly formed on the second conductive semiconductor layer.

The light emitting chip 20 may be mounted on one of the electrodes 31 and 32 or on the body 10, so that the light emitting chip 20 may be thermally connected to the thermo electric cooler module 40, but the embodiment is not limited thereto.

The light emitting chip 20 may include at least one of the LED (Light Emitting Diode). The LED may include a color LED to emit red, green, blue, or white light, or a UV (Ultra Violet) LED to emit a UV ray.

As shown in drawings, the light emitting chip 20 may be electrically connected to the electrodes 31 and 32 through a wire bonding scheme, or may be electrically connected to the electrodes 31 and 32 through a flip chip scheme or a die bonding scheme.

A encapsulant 50 may be formed in the cavity 15 of the body 10 to seal the light emitting chip 20 so that the light emitting chip 20 can be protected. The encapsulant 50 may include luminescence material.

The encapsulant 50 may include silicon or resin material. The encapsulant 50 may be formed by hardening silicon or resin material after the silicon or the resin material has been filled in the cavity 15, but the embodiment is not limited thereto.

The luminescence material may be contained in the encapsulant 50, and may be excited by a first light emitted from the light emitting chip 20 to generate a second light. For example, if the light emitting chip 20 includes a blue LED, and the luminescence material includes a yellow LED, the yellow luminescence material is excited by the blue light to emit yellow light. As the blue light is mixed with the yellow light, the light emitting device 100 can supply white light. However, the embodiment is not limited thereto.

Meanwhile, a lens (not shown) is additionally formed on the encapsulant 50, thereby adjusting the distribution of light emitted from the light emitting device 100. In addition, a zener diode (not shown) may be additionally installed in the body 10 of the light emitting device 100 in order to improve the withstanding voltage.

Figure 3:
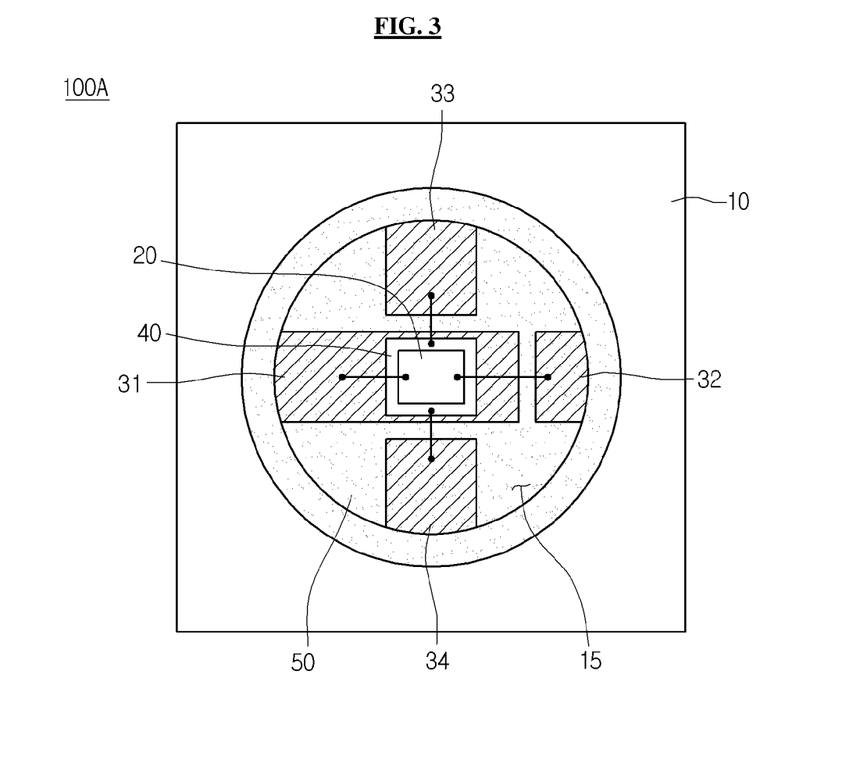
FIG. 3 is a plan view showing a light emitting device according to a second embodiment.

FIG. 3 is a plan view showing a light emitting device 100A according to the second embodiment.

Referring to FIG. 3, the light emitting device 100A according to the second embodiment includes the body 10 includes a plurality of electrodes 31, 32, 33, and 34 installed in the body 10, the light emitting chip installed in the body 10 and electrically connected to the first and second electrodes 31 and 32 among the electrodes 31, 32, 33, and 34 to emit light, and the thermo electric cooler module 40 electrically connected to the third and fourth electrodes 33 and 34 among the electrodes 31 32, 33, and 34 to cool the light emitting chip 20.

The light emitting device 100A according to the second embodiment has the same structure as that of the light emitting device 100 according to the first embodiment except for the arrangement and the wiring of the electrodes.

The light emitting chip 20 is electrically connected to the first and second electrodes 31 and 32 among the electrodes 31, 32, 33, and 34, and the thermo electric cooler module 40 is electrically connected to the third and fourth electrodes 33 and 34 among the electrodes 31 32, 33, and 34.

Accordingly, the light emitting chip 20 may be driven independently from the thermo electric cooler module 40. In other words, the quantity of current flowing in the thermo electric cooler module 40 may be adjusted according to the temperature of the light emitting chip 20 and ambient temperature, so the light emitting chip 20 can be properly cooled.

In order to adjust more effectively the quantity of current following in the thermo electric cooler module 40, a temperature sensor (not shown) such as a thermistor may be additionally provided in the body 10, but the embodiment is not limited thereto.

Figure 4:
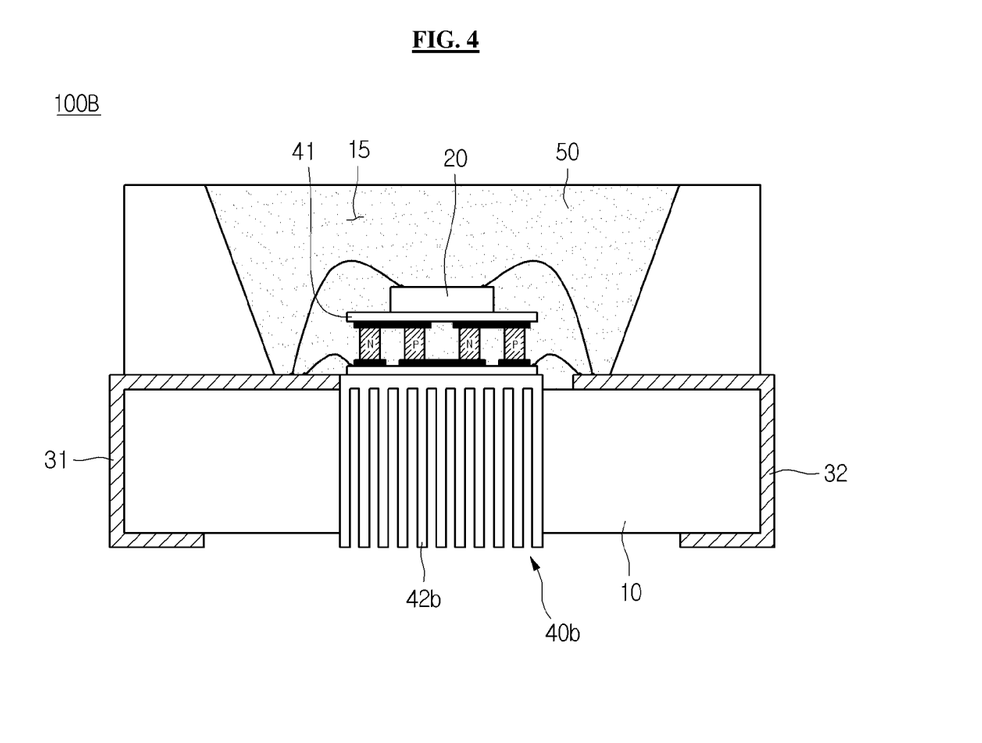
FIG. 4 is a side sectional view showing a light emitting device according to a third embodiment.

FIG. 4 is a side sectional view showing a light emitting device 100B according to a third embodiment.

Referring to FIG. 4, the light emitting device 100B according to the third embodiment includes the body 10, the electrodes 31 and 32 installed in the body 10, the light emitting chip 20 installed in the body 10 and electrically connected to the electrodes 31 and 32 to emit light, and a thermo electric cooler module 40b electrically connected to the electrodes 31 and 32 to cool the light emitting chip 20.

The light emitting device 100B according to the third embodiment has the same structure as that of the light emitting device 100 according to the first embodiment except that the thermo electric cooler module 40b passes through the body 10.

The thermo electric cooler module 40b passes through the body 10. In detail, the cooling plate 41 of the thermo electric cooler module 40b is provided in the cavity 15 of the body 10, and a heat dissipating plate 42b may be exposed to the rear surface of the body 10.

The heat dissipating plate 42b may have a concavo-convex pattern such that the heat dissipating plate 42b has a wider surface area to effectively dissipate heat.

Figure 5:
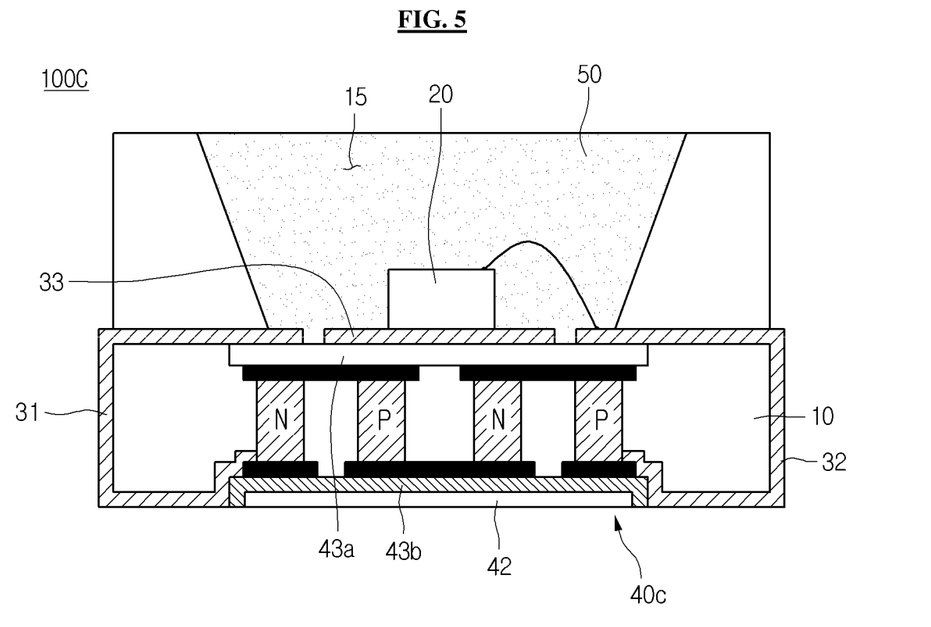
FIG. 5 is a side sectional view showing a light emitting device according to a fourth embodiment.

FIG. 5 is a side sectional view showing a light emitting device 100C according to a fourth embodiment.

Referring to FIG. 5, the light emitting device 100C according to the fourth embodiment includes the body 10 includes the electrodes 31 and 32 installed in the body 10, the light emitting chip 20 installed in the body 10 and electrically connected to the electrodes 31 and 32 to emit light, and a thermo electric cooler module 40c electrically connected to the electrodes 31 and 32 to cool the light emitting chip 20.

Differently from the light emitting device 100 according to the embodiment, the light emitting device 100C according to the fourth embodiment discloses that the thermo electric cooler module 40c passes through the body 10.

A mounting pad 33 is formed on the bottom surface of the cavity 15 of the body 10 such that the light emitting chip 20 can be mounted on the mounting pad 33. The mounting pad 33 is spaced apart from the electrodes 31 and 32.

The thermo electric cooler module 40c may make contact with lower portions of the electrodes 31 and 32, and the mounting pad 33.

The thermo electric cooler module 40c can cool the light emitting chip 20 through the electrodes 31 and 32, and the mounting pad 33.

In the thermo electric cooler module 40c, if the electrodes 31 and 32 are directly attached to the first and second polar plates 44a and 44b so that the electrodes 31 and 32 are electrically connected to the first and second polar plates 44a and 44b, the heat dissipating plate 42 is insulated from the electrodes 31 and 32. For example, the second thermal conductive insulating plate 43b extends in the direction of the lateral surface of the heat dissipating plate 42, such that the heat dissipating plate 42 can be insulated from the electrodes 31 and 32.

Figure 6:
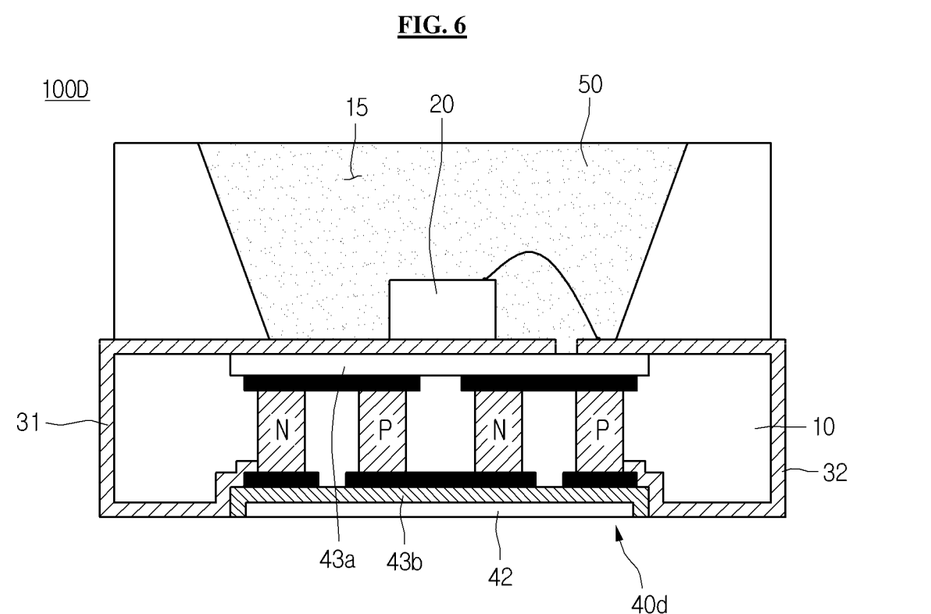
FIG. 6 is a side sectional view showing a light emitting device according to a fifth embodiment.

FIG. 6 is a side sectional view showing a light emitting device 100D according to a fifth embodiment.

Referring to FIG. 6, the light emitting device 100D according to the fifth embodiment includes the body 10 includes the electrodes 31 and 32 installed in the body 10, the light emitting chip 20 installed in the body 10 and electrically connected to the electrodes 31 and 32 to emit light, and a thermo electric cooler module 40d electrically connected to the electrodes 31 and 32 to cool the light emitting chip 20.

Differently from the light emitting device 100 according to the first embodiment, the light emitting device 100D according to the fifth embodiment discloses that the thermo electric cooler module 40d passes through the body 10. The light emitting chip 20 is formed on one of the electrodes 31 and 32. The light emitting chip 20 is provided on one of the electrodes 31 and 32, and the thermo electric cooler module 40d makes contact with the lower portion of the electrodes 31 and 32.

Accordingly, the thermo electric cooler module 40d may cool the light emitting chip 20 through the electrodes 31 and 32.

In the thermo electric cooler module 40d, if the electrodes 31 and 32 are directly attached to the first and second polar plates 44a and 44b so that the electrodes 31 and 32 are electrically connected to the first and second polar plates 44a and 44b, the heat dissipating plate 42 is insulated from the electrodes 31 and 32. For example, the second thermal conductive insulating plate 43b extends in the direction of the lateral surface of the heat dissipating plate 42, such that the heat dissipating plate 42 can be insulated from the electrodes 31 and 32.

In the light emitting device 100D of FIG. 6, a bottom surface of the light emitting chip 20 is electrically connected to the electrode 31, and a top surface of the light emitting chip 20 is connected to the electrode 32 through a wire bonding scheme.

In other words, FIG. 6 shows a vertical type light emitting device differently from the horizontal type light emitting device shown in FIGS. 1 to 5.

The light emitting chip 20 of FIG. 6 includes a reflective layer on a conductive support substrate, an ohmic contact layer on the reflective layer, a second conductive semiconductor layer on the ohmic contact layer, an active layer on the second conductive semiconductor layer, a first conductive semiconductor layer on the active layer, and a first electrode on the first conductive semiconductor layer.

Figure 7:
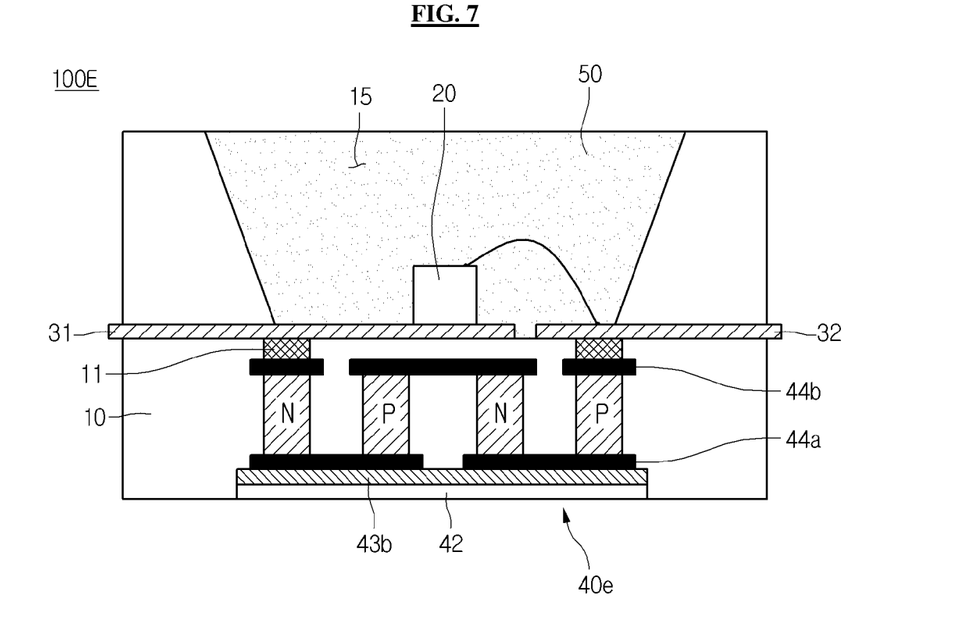
FIG. 7 is a side sectional view showing a light emitting device according to a sixth embodiment.

FIG. 7 is a side sectional view showing a light emitting device 100E according to a sixth embodiment.

Referring to FIG. 7, the light emitting device 100E according to the sixth embodiment includes the body 10 includes the electrodes 31 and 32 installed in the body 10, the light emitting chip 20 installed in the body 10 and electrically connected to the electrodes 31 and 32 to emit light, and a thermo electric cooler module 40e electrically connected to the electrodes 31 and 32 to cool the light emitting chip 20.

Differently from the light emitting device 100 according to the first embodiment, the light emitting device 100E according to the fifth embodiment discloses that the thermo electric cooler module 40e passes through the body 10, and a conductive via 11 is formed in the body 10 to electrically connect the electrodes 31 and 32 with the second polar plate 44b of the thermo electric cooler module 40e.

In other words, one end of the conductive via 11 is directly connected to the electrodes 31 and 32 in the body 10, and an opposite end of the conductive via 11 is directly connected to the polar plate 44b of the thermo electric cooler module 40e buried in the body 10.

The configuration of the polar plates 44a and 44b of the thermo electric cooler module 40e and the semiconductor layer is formed inversely to those of the first embodiment, so that the polar plate 44b is connected to the via 11.

The light emitting chip 20 may be formed on one of the electrodes 31 and 32, and may be provided separately from the electrodes 31 and 32 as shown in FIG. 5.

Figure 8:
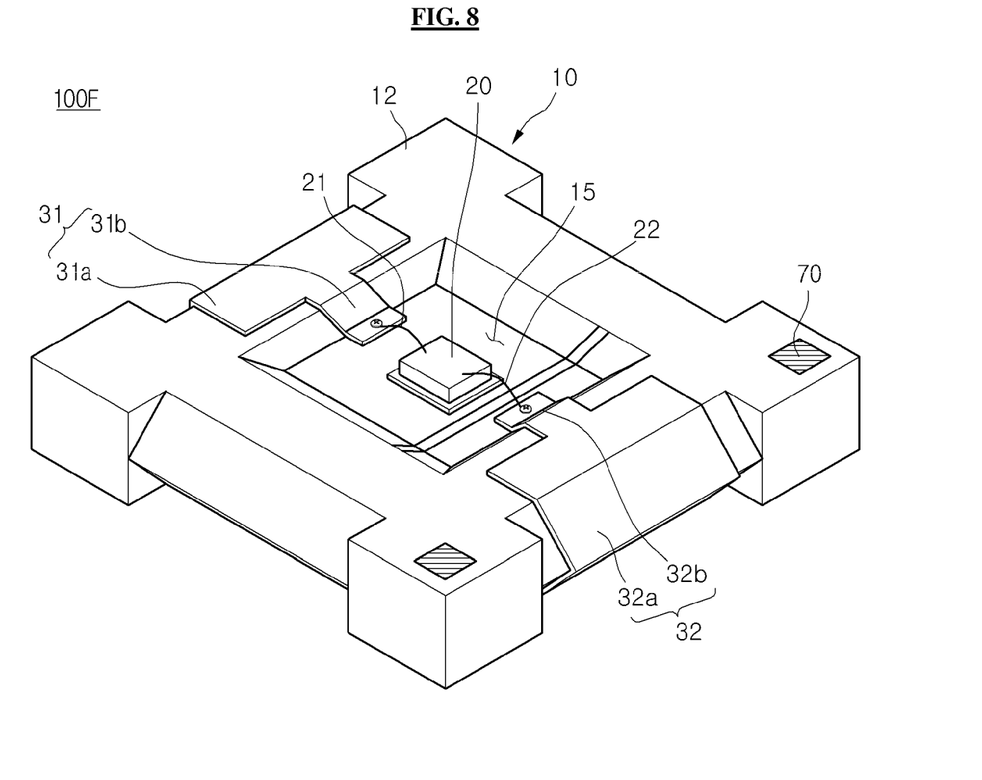
FIG. 8 is a side sectional view showing a light emitting device according to a seventh embodiment.

FIG. 8 is a perspective view showing a light emitting device 100F according to a seventh embodiment.

Referring to FIG. 8, the light emitting device 100F according to the seventh embodiment includes a body 10, an insulating layer 12 including silicon oxide (SixOy) and formed on the surface of the body 10, at least one light emitting chip 20 provided on the body 10, and the electrodes 31 and 32 provided on the body 10 and electrically connected to the light emitting chip 20.

The body 10 may include silicon (Si), aluminum (Al), aluminum nitride (AlN), $AlO_x$, PSG (Photo Sensitive Glass), sapphire ($Al_2O_3$), beryllium oxide (BeO), a PCB (Printed Circuit Board), or various resin materials, but the embodiment is not limited thereto.

For example, the body 10 may be formed through injection molding, or may be formed by stacking a plurality of layers.

If the body 10 includes Si, a protective device such as a zener diode may be formed in the form of an integrated circuit by injecting conductive dopants into the body 10, but the embodiment is not limited thereto.

The cavity 15 may be formed in the body 10 such that the body 10 has an open upper portion. For example, the cavity 15 may be formed through injection molding or etching.

The cavity 15 may have a cup shape or a concave container shape. The inner lateral surface of the cavity 15 is perpendicular to the bottom surface of the body or inclined with respect to the bottom surface. If the inclined lateral surface of the cavity 15 is formed by performing a wet etching process with respect to the body 10 including Si, the inclined lateral surface may have an inclination angle in the range of about 50° to about 60°.

In addition, the cavity 15 may have a surface in a circular shape, a rectangular shape, a polygonal shape, or an oval shape.

The insulating layer 12 may be formed on the surface of the body 10.

The insulating layer 12 prevents the body 10 from being electrically shorted with the electrodes 31 and 32 or an external power source. Accordingly, if the body 10 includes an insulator such as AN or AlOx, the insulating layer 12 may not be formed.

The insulating layer 12 may include at least one selected from the group consisting of $SiO_2$, $Si_xO_y$, $Si_3N_4$, $Si_xN_y$, $SiO_xN_y$, and $Al_2O_3$. Preferably, the insulating layer 12 may include silicon oxide ($SiO_2$ or $Si_xO_y$), but the embodiment is not limited thereto.

If the body 10 includes Si, the insulating layer 12 may be provided in the form of a silicon oxide film through a thermal oxidation scheme. The insulating layer 12 may be formed through a sputtering scheme, a PECVD (Plasma Enhanced Chemical Vapor Deposition) scheme, or an E-beam deposition scheme, but the embodiment is not limited thereto.

The electrodes 31 and 32 may be formed on the insulating layer 12. The electrodes 31 and 32 electrically act as a cathode and an anode, respectively, to supply power to the thermo electric cooler module (not shown) provided on the light emitting chip 20 and in the body 10.

Meanwhile, cathode marks 70 may be formed on the body 10 in order to distinguish between the electrodes 31 and 32, but the embodiment is not limited thereto.

As shown in FIG. 8, the electrodes 31 and 32 may include electrode body parts 31a and 32a and extension parts 31b and 32b protruding the electrode body parts 31a and 32a. The widths of the extension parts 31b and 32b may be less than the widths of the electrode body parts 31a and 32a. Only the extension parts 31b and 32b may be provided in the cavity 15 of the body 10. In addition, wires 21 and 22 are bonded to the extension parts 31b and 32b so that the electrodes 31 and 32 can be electrically connected with the light emitting diode 20.

The light emitting chip 20 may be mounted on the body 10. If the body 10 includes the cavity 15, the light emitting diode 20 may be installed in the cavity 15.

As shown in FIGS. 5 to 7, the thermo electric cooler module 40c, 40d, or 40e may be buried in the body 10. As shown in FIGS. 5 and 6, the electrodes 31 and 32 surround an outer portion of the body 10 while extending the bottom surface of the body 10, so that the electrodes 31 and 32 can be electrically connected to the thermo electric cooler module 40c, 40d, or 40e. As shown in FIG. 7, the electrodes 31 and 32 can be connected to the thermo electric cooler module 40c, 40d, or 40e in the body 10 through a conductive via 11.

Although the embodiment has been described in that the light emitting device package has a top view type, the light emitting device package may have a side view type. Accordingly, a heat sink characteristic, conductivity, and a reflectance characteristic can be improved. The light emitting device package according to the embodiment may be applied to an indicator, a signal lamp, a headlight of a vehicle, an electric sign board, a lighting device, and a display device.

Hereinafter, applications of the disclosure will be described with reference to FIGS. 9 and 10.

Figure 9:
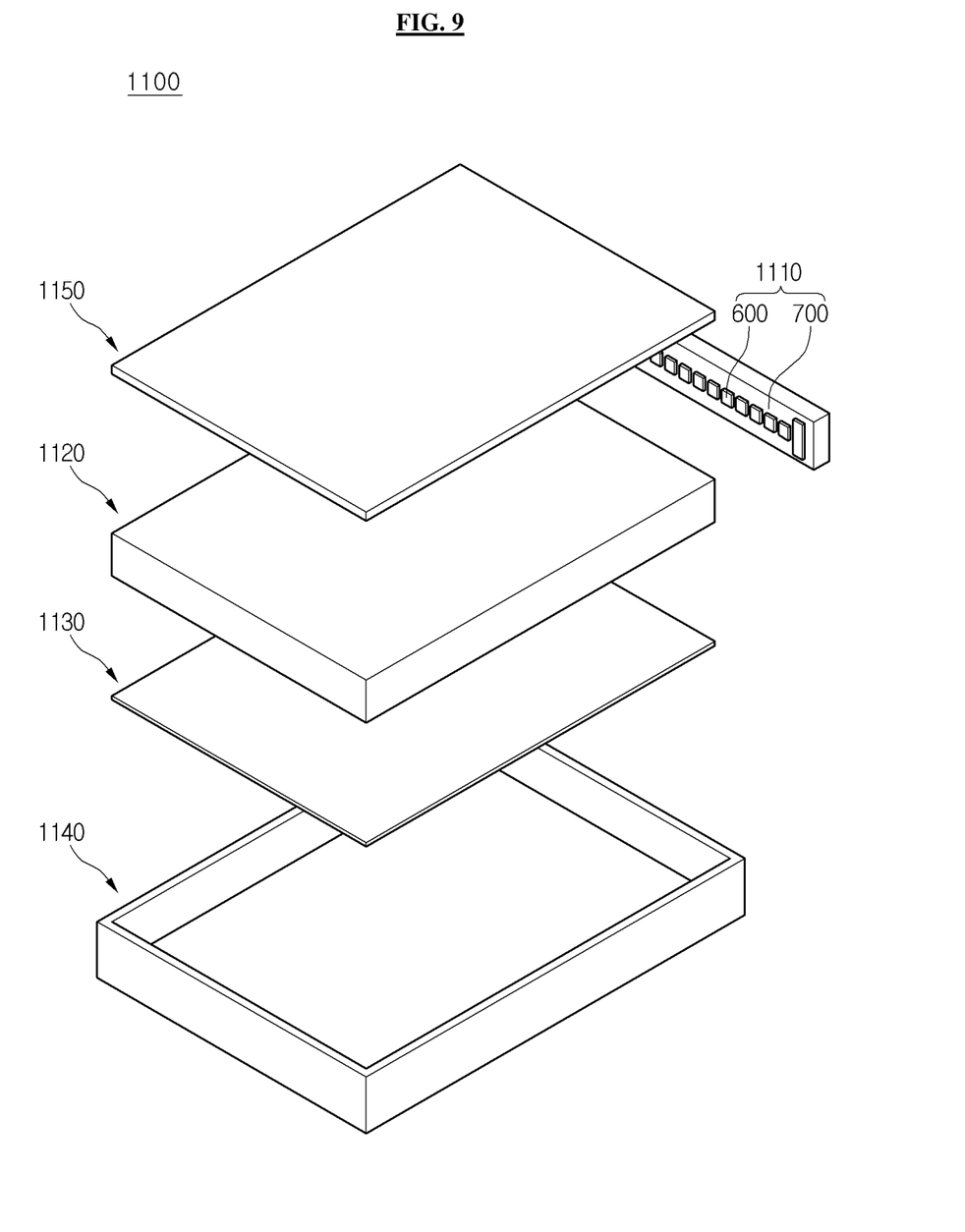
FIG. 9 is a perspective view showing a backlight unit including a light emitting device according to an embodiment.

FIG. 9 is a perspective view showing a backlight unit 1100 including the light emitting device according to the disclosure.

The backlight unit 1100 shown in FIG. 9 is an example of a lighting system and the embodiment is not limited thereto.

Referring to FIG. 9, the backlight unit 1100 includes a bottom cover 1140, a light guide member 1120 provided in the bottom cover 1140, and a light emitting module 1110 installed at one side or over the bottom surface of the light guide member 1120. In addition, a reflective sheet 1130 is disposed under the light guide member 1120.

The bottom cover 1140 has a box shape having an open top surface to receive the light guide member 1120, the light emitting module 1110 and the reflective sheet 1130 therein. In addition, the bottom cover 1140 may include metallic material or resin material, but the embodiment is not limited thereto.

The light emitting module 1110 may include a plurality of light emitting devices 600 installed over a substrate 700. The light emitting devices 600 provide the light to the light guide member 1120.

As shown in FIG. 9, the light emitting module 1110 is installed over at least one inner side of the bottom cover 1140 to provide the light to at least one side of the light guide member 1120.

In addition, the light emitting module 1110 can be provided under the light guide member 1120 in the bottom cover 1140 to provide the light toward the bottom surface of the light guide member 1120. Such an arrangement can be variously changed according to the design of the backlight unit 1100.

The light guide member 1120 is installed in the bottom cover 1140. The light guide member 1120 converts the light emitted from the light emitting module 1110 into the surface light to guide the surface light toward a display panel (not shown).

For example, the light guide member 1120 may include a light guide plate. For instance, the light guide plate may be manufactured by using acryl-based resin, such as PMMA (Polymethyl Methacrylate), PET (Polyethylene Terephthalate), COC (copolymers of cycloolefins), PC (Polycarbonate) or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected over the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including luminescence material.

The reflective sheet 1130 can be disposed under the light guide member 1120. The reflective sheet 1130 reflects the light, which is emitted through the bottom surface of the light guide member 1120, toward the light exit surface of the light guide member 1120. The reflective sheet 1130 may include resin material having a high reflectance, such as PET, PC or PVC resin, but the embodiment is not limited thereto.

Figure 10:
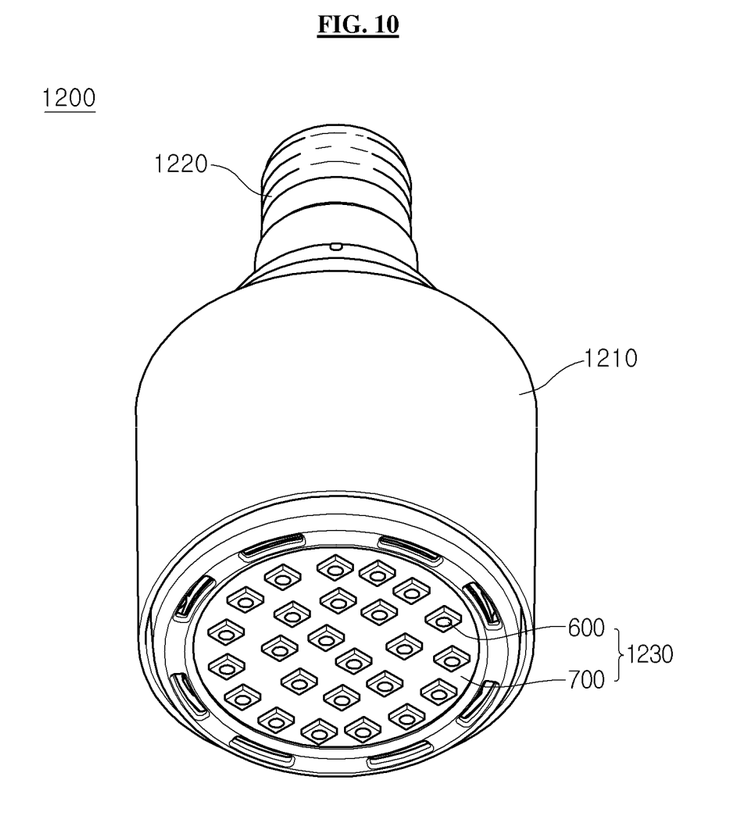
FIG. 10 is a view showing a lighting system including a light emitting device according to an embodiment.

FIG. 10 is a perspective view showing a lighting system 1200 including the light emitting device according to the embodiment. The lighting system 1200 shown in FIG. 10 is only one example and the embodiment is not limited thereto.

Referring to FIG. 10, the lighting system 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting device 600 installed over the substrate 700.

The substrate 700 includes an insulating member printed with a circuit pattern. For instance, the substrate 700 includes a PCB (printed circuit board), an MC (metal core) PCB, an F (flexible) PCB, or a ceramic PCB.

In addition, the substrate 700 may include material that effectively reflects the light. The surface of the substrate 700 can be coated with a color, such as a white color or a silver color, to effectively reflect the light.

At least one light emitting device 600 can be installed over the substrate 700.

Each light emitting device 600 may include at least one LED (light emitting diode). The LED may include a colored LED that emits the light having the color of red, green, blue or white and a UV (ultraviolet) LED that emits UV light.

The light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 10, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided on the path of the light emitted from the light emitting module, so that the desired optical effect can be achieved.

Since the backlight unit 1100 and the lighting system 1200 shown in FIGS. 9 and 10 include the light emitting modules 1110 and 1230 having the light emitting devices shown in FIGS. 1 to 8, the backlight unit 1100 and the lighting system 1200 can obtain superior light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body;
a first to a fourth electrodes in the body;
a light emitting chip installed in the body to generate light; and
a thermo electric cooler module at a lower portion of the light emitting chip to cool the light emitting chip,
wherein a first portion of the light emitting chip is electrically connected to the first electrode using a first wire, a first portion of the thermo electric cooler module is electrically connected to the second electrode using a second wire, a second portion of the light emitting chip is electrically connected to the third electrode using a third wire, and a second portion of the thermo electric cooler module is electrically connected to the fourth electrode using a fourth wire,
wherein the thermo electric cooler module is disposed on the first electrode, and
wherein the light emitting chip is vertically overlapped with the thermo electric cooler and the first electrode.

2. The light emitting device of claim 1, further comprising a temperature sensor.

3. The light emitting device of claim 1, wherein the thermo electric cooler module includes a cooling plate, a heat dissipating plate, and at least one semiconductor pairs between the cooling plate and the heat dissipating plate.

4. The light emitting device of claim 3, wherein the cooling plate of the thermo electric cooler module is disposed at a lower portion of the light emitting chip.

5. The light emitting device of claim 3, wherein the heat dissipating plate is disposed on a bottom surface of the thermo electric cooler module and includes a plurality of protrusions.

6. The light emitting device of claim 3, wherein the thermo electric cooler module includes a plurality of electrode plates formed at an upper and a lower portions of the semiconductor pairs to connect the semiconductor pairs to each other in series.

7. The light emitting device of claim 6, wherein the thermo electric cooler module further includes insulating layers between the electrode plates and the cooling plate, and between the electrode plates and the heat dissipating plate.

8. The light emitting device of claim 7, wherein the semiconductor pairs include alternately aligned N-type and P-type semiconductors between the cooling plate and the heat dissipating plate.

9. The light emitting device of claim 1, wherein the thermo electric cooler module is interposed between the light emitting chip and the first electrode.

10. The light emitting device of claim 1, wherein the thermo electric cooler module protrudes through the body.

11. The light emitting device of claim 10, wherein the light emitting chip is mounted on the thermo electric cooler module.

12. The light emitting device of claim 1, wherein the light emitting chip includes at least one light emitting diode.

13. The light emitting device of claim 1, wherein the body includes a cavity and the light emitting chip is provided in the cavity.

14. The light emitting device of claim 13, further comprising an encapsulant in the cavity.

15. The light emitting device of claim 13, wherein the thermo electric cooler module is disposed in the cavity.

16. The light emitting device of claim 1, wherein the light emitting chip is driven independently from the thermo electric cooler module.

\* \* \* \* \*